United States Patent
La Rosa et al.

(10) Patent No.: US 9,443,598 B2
(45) Date of Patent: Sep. 13, 2016

(54) METHOD FOR PROGRAMMING A NON-VOLATILE MEMORY CELL COMPRISING A SHARED SELECT TRANSISTOR GATE

(71) Applicant: STMicroelectronics (Rousset) SAS, Rousset (FR)

(72) Inventors: Francesco La Rosa, Rousset (FR); Stephan Niel, Greasque (FR); Arnaud Regnier, Les Taillades (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/719,913

(22) Filed: May 22, 2015

(65) Prior Publication Data

US 2015/0348635 A1    Dec. 3, 2015

(30) Foreign Application Priority Data

May 28, 2014 (FR) .................... 14 54839

(51) Int. Cl.
*G11C 16/04* (2006.01)
*G11C 16/14* (2006.01)
*H01L 27/115* (2006.01)

(52) U.S. Cl.
CPC .......... *G11C 16/14* (2013.01); *G11C 16/0408* (2013.01); *G11C 16/0425* (2013.01); *G11C 16/0458* (2013.01); *G11C 16/0475* (2013.01); *H01L 27/11517* (2013.01); *H01L 27/115* (2013.01)

(58) Field of Classification Search
CPC .............. G11C 16/10; G11C 16/0483; G11C 13/0069; G11C 16/3459; G11C 11/5628; G11C 7/18; G11C 7/14; G11C 13/003; G11C 16/0416; G11C 16/0433; G11C 16/0441; G11C 16/34; G11C 2211/5621
See application file for complete search history.

(56) References Cited

U.S. PATENT DOCUMENTS

| 2003/0035329 A1* | 2/2003 | Tailliet ............... G11C 16/0433 365/200 |
| 2005/0286310 A1* | 12/2005 | Roohparvar ........... G11C 5/145 365/185.28 |
| 2011/0026294 A1 | 2/2011 | Tsukamoto et al. |

(Continued)

FOREIGN PATENT DOCUMENTS

FR    2987697 A1    9/2013

OTHER PUBLICATIONS

Ahn, B. J. et al., "A Simple and Efficient Self-Limiting Erase Scheme for High Performance Split-Gate Flash Memory Cells," IEEE Electron Device Letters 19(11):438-440, Nov. 1998.

*Primary Examiner* — Son Dinh
*Assistant Examiner* — Uyen B Tran
(74) *Attorney, Agent, or Firm* — Seed IP Law Group PLLC

(57) ABSTRACT

The present disclosure relates to a method for controlling two twin memory cells each comprising a floating-gate transistor comprising a state control gate, in series with a select transistor comprising a select control gate common to the two memory cells, the drains of the floating-gate transistors being connected to a same bit line, the method comprising steps of programming the first memory cell by hot-electron injection, by applying a positive voltage to the bit line and a positive voltage to the state control gate of the first memory cell, and simultaneously, of applying to the state control gate of the second memory cell a positive voltage capable of causing a programming current to pass through the second memory cell, without switching it to a programmed state.

14 Claims, 6 Drawing Sheets

(56) References Cited

U.S. PATENT DOCUMENTS

| | | | |
|---|---|---|---|
| 2013/0182509 A1* | 7/2013 | Lee | G11C 16/3459 365/185.22 |
| 2013/0229875 A1 | 9/2013 | La Rosa et al. | |
| 2014/0097481 A1 | 4/2014 | La Rosa et al. | |
| 2014/0269058 A1* | 9/2014 | Liu | G11C 11/5628 365/185.03 |
| 2016/0071598 A1* | 3/2016 | La Rosa | G11C 16/0433 365/185.05 |

* cited by examiner

METHOD FOR PROGRAMMING A NON-VOLATILE MEMORY CELL COMPRISING A SHARED SELECT TRANSISTOR GATE

BACKGROUND

1. Technical Field

The present disclosure relates to electrically erasable and programmable non-volatile memories (EEPROM). The present disclosure relates more particularly to a non-volatile memory, comprising memory cells each comprising a floating-gate transistor and a select transistor gate shared with a so-called "twin" adjacent memory cell.

2. Description of the Related Art

FIG. 1 is a wiring diagram of memory cells C11, C12 of the above-mentioned type, belonging to two adjacent pages Pi, Pi+1 of a memory array. The memory cells C11, C12 are read- and write-accessible through a bit line BL, a word line WL<i,i+1> and control gate lines CGL<i>, CGL<i+1>. Each memory cell comprises a floating-gate transistor, respectively FGT11, FGT12. A control gate CG of the transistor FGT11 is connected to the control gate line CGL<i> through a contact C4. A control gate CG of the transistor FGT12 is connected to the control gate line CGL<i+1> through a contact C4. Drain regions of the transistors FGT11, FGT12 are connected to a bit line BL through contacts C1. A select control gate SGC is connected to a word line WL<i,i+1> common to the two memory cells through a contact C3. Each floating-gate transistor FGT11, FGT12 also has a source terminal coupled to a source line SL through a respective select transistor ST11, ST12. The select transistors ST11, ST12 share a same select control gate SGC. The two memory cells C11, C12 are referred to as twins due to the fact that they share the same select control gate SGC and the same bit line BL. The channel regions CH1, CH2 of the transistors FGT11, FGT12, ST11, ST12 are at the electric potential of the well PW, as represented by dotted lines. Finally, the source regions of the transistors ST11, ST12 are electrically coupled to the source line SL. The latter can be connected through a contact C5 to a main source line produced in a layer of metal.

Each common control gate SGC is preferentially a vertical gate embedded in a substrate receiving the memory array, the source line SL also being an embedded line. The common control gates SGC, or twin memory cell select gates, are connected to the word line WL<i,i+1>.

Such memory cells are erased or programmed by the channel, i.e., by putting the substrate to a positive erase voltage or negative programming voltage causing electric charges to be extracted from their floating gates or electric charges to be injected into their floating gates, by Fowler-Nordheim effect.

More particularly, a memory cell is erased by combining the positive voltage applied to the substrate with a negative voltage applied to the control gate CG of its floating-gate transistor, while the control gate of the floating-gate transistor of the twin memory cell receives a positive erase-inhibit voltage preventing it from being simultaneously erased.

Similarly, a memory cell is programmed by combining a negative voltage applied to the bit line BL and to the substrate PW with a positive voltage applied to the control gate CG of its floating-gate transistor, while the control gate of the floating-gate transistor of the twin memory cell receives a negative program-inhibit voltage preventing it from being simultaneously programmed.

Finally, a memory cell is read by applying a positive voltage to the control gate of its floating-gate transistor, as well as a positive voltage to the corresponding bit line, while the twin memory cell, which is connected to the same bit line, receives on its control gate a negative read-inhibit voltage preventing it from being simultaneously read.

This memory array structure having twin memory cells comprising a shared vertical select gate embedded in the substrate, offers the advantage of having a small footprint.

This conventional memory array and memory cell structure also includes a word line decoder capable of applying a positive read voltage to a memory cell to be read, while applying a negative read-inhibit voltage to its twin memory cell, as explained above.

It could thus be desirable to simplify the line decoder. It could also be desirable to optimize the operations of reading and programming the memory cells, in particular in terms of current consumption.

BRIEF SUMMARY

Some embodiments relate to a method for controlling a non-volatile memory on a semiconductor substrate, comprising: at least one bit line, at least two control gate lines, at least one word line, and at least one pair of twin memory cells, comprising a first memory cell comprising a first floating-gate transistor having a control gate coupled to a first control gate line, a first conduction terminal coupled to the bit line and a second conduction terminal coupled to a source line through a first select transistor having a select control gate coupled to the word line, and a second memory cell comprising a second floating-gate transistor having a control gate coupled to the second control gate line, a first conduction terminal coupled to the bit line and a second conduction terminal coupled to the source line through a second select transistor sharing the select control gate with the first select transistor. According to one embodiment, the method comprises steps of: programming the first memory cell by hot-electron injection, by means of a programming current passing through the first memory cell, by applying a first positive voltage to the bit line and a second positive voltage to the first control gate line, and when programming the first memory cell, applying to the second control gate line a third positive voltage capable of causing a programming current to pass through the second memory cell, without switching the second memory cell to a programmed state.

According to one embodiment, the third voltage is chosen so as to ensure a soft programming of the second memory cell, so that the second memory cell cannot have a negative threshold voltage whether it is in a programmed or an erased state.

According to one embodiment, the method comprises steps of reading a memory cell of the pair of memory cells, consisting of: applying a positive read voltage to the control gate of the floating-gate transistor of the memory cell that must be read, and applying a zero voltage to the control gate of the floating-gate transistor of the twin memory cell.

According to one embodiment, the method comprises an erasing step consisting of simultaneously applying an erase voltage to the control gates of the floating-gate transistors of the first and second memory cells.

According to one embodiment, the operation of programming the first memory cell comprises steps of checking the depleted state of the pair of memory cells, and of performing a programming of the first memory cell and a soft programming of the second memory cell while one or other of the first and second memory cells is in the depleted state, followed by steps of checking the programmed state of the first memory cell, and of programming the first memory cell while the latter is not in the programmed state.

Some embodiments also relate to a non-volatile memory on a semiconductor substrate, comprising: at least one bit line, at least two control gate lines, at least one word line, at least one pair of twin memory cells, comprising a first memory cell comprising a first floating-gate transistor having a control gate coupled to a first control gate line, a first conduction terminal coupled to the bit line and a second conduction terminal coupled to a source line through a first select transistor having a select control gate coupled to the word line, and a second memory cell comprising a second floating-gate transistor having a control gate coupled to the second control gate line, a first conduction terminal coupled to the bit line and a second conduction terminal coupled to the source line through a second select transistor sharing the select control gate with the first select transistor, and means for programming the first memory cell independently of the second memory cell and vice versa. According to one embodiment, the memory is configured to: program the first memory cell by hot-electron injection, by means of a programming current passing through the first memory cell, by applying a first positive voltage to the bit line and a second positive voltage to the first control gate line, and when programming the first memory cell, apply to the second control gate line a third positive voltage capable of causing a programming current to pass through the second memory cell, without switching the second memory cell to a programmed state.

According to one embodiment, the third voltage is chosen so as to ensure a soft programming of the second memory cell, so that the second memory cell cannot have a negative threshold voltage whether it is in a programmed or an erased state.

According to one embodiment, the memory comprises a word line decoder coupled to the word line and to the control gate lines, the decoder being configured, when reading a memory cell of the pair of twin memory cells, to apply a positive read voltage to the control gate of the floating-gate transistor of the memory cell that must be read, and to apply a zero voltage to the control gate of the floating-gate transistor of the twin memory cell.

According to one embodiment, the select control gate is an embedded vertical gate having for the first select transistor a vertical channel region extending opposite a first face of the embedded vertical control gate, and for the second select transistor a vertical channel region extending opposite a second face of the embedded vertical control gate, and opposite the channel region of the first select transistor.

According to one embodiment, the memory cells of the pair of twin memory cells share a single select transistor.

According to one embodiment, the pair of memory cells comprises: a first doped region extending along a first upper edge of the embedded gate, forming a drain region of the select transistor and a source region of the floating-gate transistor, of a first memory cell of the pair of memory cells, a second doped region extending along a second upper edge of the embedded gate opposite the first upper edge, forming a drain region of the select transistor and a source region of the floating-gate transistor, of a second memory cell of the pair of memory cells, and a third doped region extending along two opposite lower edges of the embedded gate, forming a source region common to the select transistor of the first memory cell and to the select transistor of the second memory cell, each select transistor of the pair of memory cells having a vertical channel region extending on a respective side of the embedded gate, between the first or the second doped region and the third doped region.

According to one embodiment, the memory comprises a word line decoder coupled to the word line and to the control gate lines, the decoder being configured, when erasing memory cells, to simultaneously apply an erase voltage to the first and second control gate lines.

According to one embodiment, the memory is configured, during the operation of programming the first memory cell, to: check the depleted state of the pair of memory cells, and program the first memory cell and simultaneously apply a soft programming to the second memory cell, while one or other of the first and second memory cells is in the depleted state, and check the programmed state of the first memory cell, and program the first memory cell while the latter is not in the programmed state.

According to one embodiment, the memory comprises a row of pairs of twin memory cells connected to the word line and to the control gate lines, the memory being configured to program a word formed by several memory cells of the row, connected to one of the two control gate lines, and, when programming the word, to: perform an operation of reading the row of pairs of twin memory cells and storing the words read, perform an operation of erasing the row of pairs of twin memory cells read, perform a word programming of the memory cells of the row of pairs of memory cells, comprising programming the first memory cell of the pairs of memory cells in the row, according to the words stored and possibly to the word to be written, and simultaneously perform a soft programming of second twin memory cells of the first memory cells programmed, and perform a second operation of programming the second memory cell of the pairs of memory cells in the row, according to the words stored and possibly to the word to be written, and simultaneously perform a soft programming of the first twin memory cells of the second memory cells programmed.

BRIEF DESCRIPTION OF THE SEVERAL VIEWS OF THE DRAWINGS

Some examples of embodiments of the present disclosure will be described below in relation with, but not limited to, the following figures, in which.

DETAILED DESCRIPTION

Figure 2:
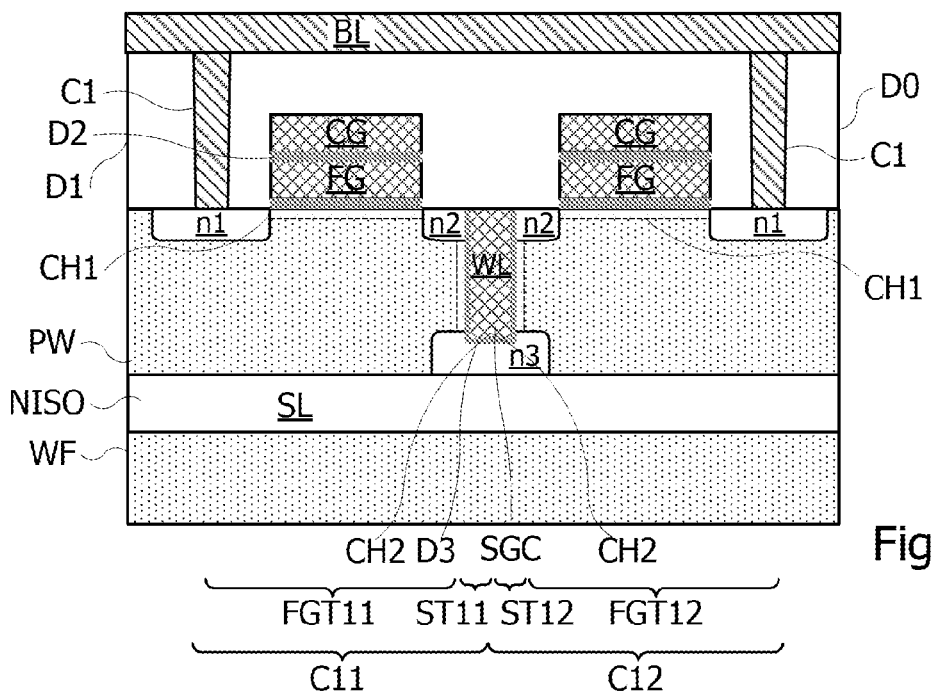
FIG. 2 is a schematic cross-section of a pair of twin memory cells sharing a common select transistor vertical gate.

FIG. 2 is a schematic cross-section of two twin memory cells C11, C12, comprising a select transistor vertical gate SGC, common to the two memory cells. The memory cells C11, C12 are produced on a P-type conductivity substrate PW. The substrate is formed in a semiconductor wafer WF. The well PW is isolated from the rest of the wafer WF by an N-doped isolation layer NISO surrounding the entire well. Each memory cell C11, C12 comprises a floating-gate transistor FGT11, FGT12 and a select transistor ST11, ST12. Each floating-gate transistor FGT11, FGT12 comprises a drain region n1, a source region n2, a floating gate FG, a state control gate CG, and a channel region CH1 extending beneath the floating gate FG between the drain n1 and source n2 regions. The vertical select gate SGC is embedded in the substrate PW and isolated from the latter by an insulating layer D3, for example made of oxide SiO2, forming the gate oxide of the select transistors ST11, ST12. The region n2 extends along an upper edge of the embedded vertical gate SGC. The gate SGC reaches a source region n3 common to the transistors ST11, ST12, in contact with the layer NISO which thus forms a source line SL of the transistors S11, ST12. The region n3 extends along two lower edges of the vertical gate SGC. Each select transistor ST11, ST12 thus comprises a drain region common to the source region n2 of the floating-gate transistor FGT11, FGT12 of its cell, the common source region n3, and a channel region CH2 extending vertically along the gate SGC between the drain n2 and source n3 regions. It shall be noted that the region n3 can be omitted if the gate SGC reaches the layer NISO.

The regions n1, n2, n3 are generally formed by N-doping the substrate PW. The floating gates FG are generally made of level-1 polycrystalline silicon, or "poly1", and are formed on the substrate PW through a tunnel oxide layer D1. The state control gates CG are generally made of level-2 polycrystalline silicon, or "poly2". Each state control gate CG is formed on one of the floating gates FG previously covered with an oxide layer D2. The gate SGC is formed in a trench filled with level-0 polycrystalline silicon, or "poly0", isolated from the substrate by the oxide layer D3. Depending on the manufacturing method chosen, the conducting trench forming the gate SGC may not have any electrical discontinuity. It can then be used directly as word line WL.

The two memory cells C11, C12 are covered with a dielectric insulating material D0, which can also be oxide SiO2. The drain regions n1 of the transistors FGT11, FGT12 are coupled to a same bit line BL through a contact C1 passing through the insulating material D0.

Figure 3:
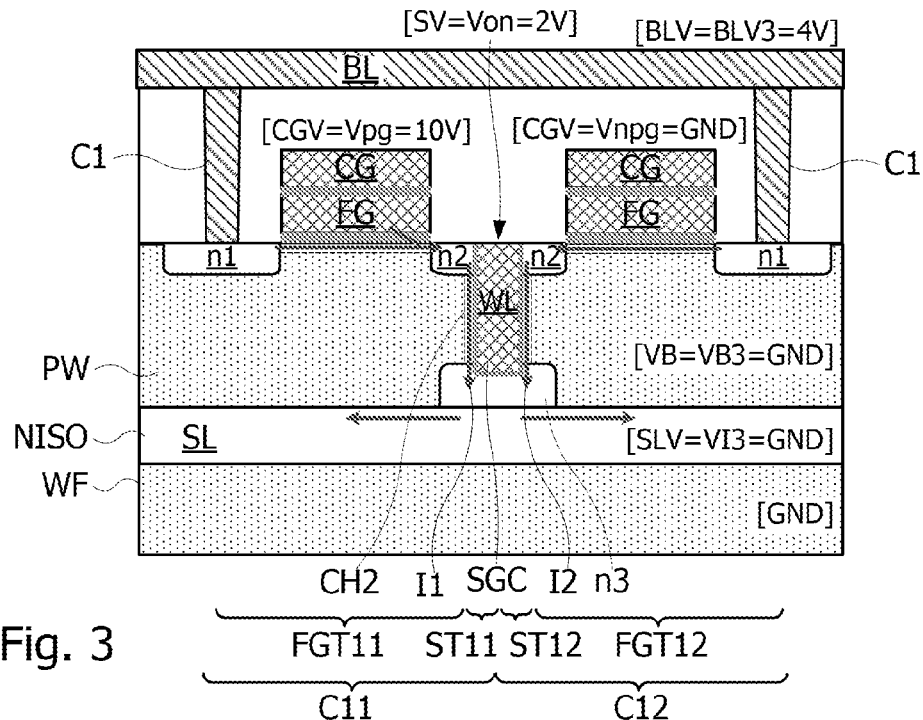
FIG. 3 is a schematic cross-section of the pair of memory cells in FIG. 1, showing a method for programming a memory cell.

Table PG1 in Appendix 1 describes, in connection with FIG. 3, values of voltages applied to the memory cells when programming the memory cell C11. The "Ref." column describes the reference given to each voltage value and the "E.g." column describes examples of voltage values. "GND" is the ground potential, i.e., the potential of the wafer WF, generally 0V. During the hot-electron programming of the memory cell C11, the two transistors FGT11, ST11 cooperate in order to inject electric charges into the floating gate FG. The select transistor ST11 has a conducting channel CH2 in which a current I1 forms (represented by arrows on FIG. 3) comprising high kinetic energy electrons, referred to as "hot electrons". When the current I1 reaches the conducting channel CH1 of the floating-gate transistor FGT11, an injection zone forms where certain high energy electrons are injected into the floating gate FG under the effect of a transverse electric field created by the voltage applied to the control gate CG. The charges are thus transferred from the substrate PW to the floating gate FG (programming) by passing through the select transistor ST11, and by applying a high difference in potential (here 10V) on the floating gate, enabling this charge transfer. It may be noted that in the twin cell C12, a current 12 (represented by arrows on FIG. 3) also flows in the channel CH1 of the transistor FGT12 and in the channel CH2 of the transistor ST12. The current 12 is not sufficient to program the cell C12 due to the fact that the control gate CG of the transistor FGT12 receives an insufficient voltage (GND) to form an electric field capable of injecting electrons into the floating gate FG of this transistor. The presence of the current 12, which is not insignificant, thus results in pointless current consumption.

Table ER1 in Appendix 1 provides values of voltages applied to the memory cells when erasing the memory cell C11. The erasing is performed without going through the select transistor ST11 which remains off, by applying a high electric field (here 10V) between the source and the floating gate FG of the memory cell to be erased. Thus, the electrons are extracted from the floating gate by tunnel effect (Fowler-Nordheim effect). The erasing of the twin memory cell C12 is prevented by applying a non-erase voltage Vner (for example 2.5V) on the control gate of the transistor FGT12. The erasing of memory cells is generally performed by page of memory cells. However, all the memory cells of a page do not have identical erase threshold voltages, in particular due to variations in the thickness of gate oxide from one memory cell to another. The result is that the memory cells do not erase at the same pace, and that certain memory cells are in an "over-erased" state in which their floating gate FG is in the depleted state. Such a state is not desirable as it can generate reading errors.

Figure 4:
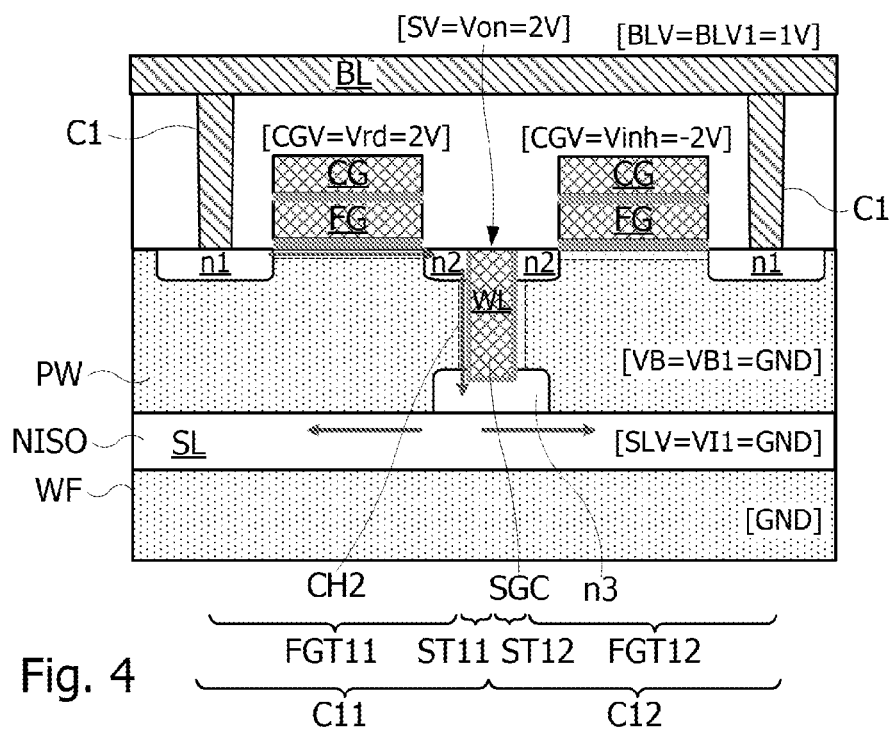
FIG. 4 is a schematic cross-section of the pair of memory cells in FIG. 1, showing a method for reading a memory cell.

Table RD1 in Appendix 1 indicates, in connection with FIG. 4, values of voltages applied to the memory cells when reading the memory cell C11. Thus, when reading the memory cell C11, the common select gate SGC of the two select transistors ST11 and ST12 receives the read-select voltage Von. The transistors ST11, ST12 are thus on. A current (represented by arrows on FIG. 4) flows in the channel region CH1 of the transistor FGT11 and in the channel region CH2 of the transistor ST11. This current is representative of the threshold voltage of the transistor FGT11 which is itself representative of a programmed or erased state of the transistor, which depends on a quantity of electric charges stored in its floating gate FG. This current is sensed by a sense amplifier not represented in FIG. 4, which supplies a binary datum stored by the memory cell C11. Therefore, the select transistor ST12 of the neighboring memory cell C12 is also put to the on state, and its channel CH2 is conducting. If the transistor FGT12 is in an over-erased state, it can also be on. The result is that the memory cell C11 will be seen as on during the reading and thus erased, even though it is off (programmed). In order to avoid this phenomenon, the voltage CGV applied to the control gate of the transistor FGT12 can be set to an inhibit voltage Vinh which forces the transistor FGT12 to the off state and thus prevents it from conducting, even if it is in the over-erased state. In Table RD1, this voltage is chosen equal to −2V which is lower than the threshold voltage of the floating-gate transistors in the erased state. However, the generation of such a negative voltage results in an increase in the current consumption of an operation of reading the memory, and use a more complex gate voltage control circuit CGV.

In a Flash-type memory, one well-known method involves proceeding with a soft programming operation following an erasing operation, to increase the threshold voltages of the erased memory cells and thus prevent certain memory cells from being in the over-erased state. However, this solution inevitably increases the current consumption of the memory and the duration of the erasing operations.

Figure 5:
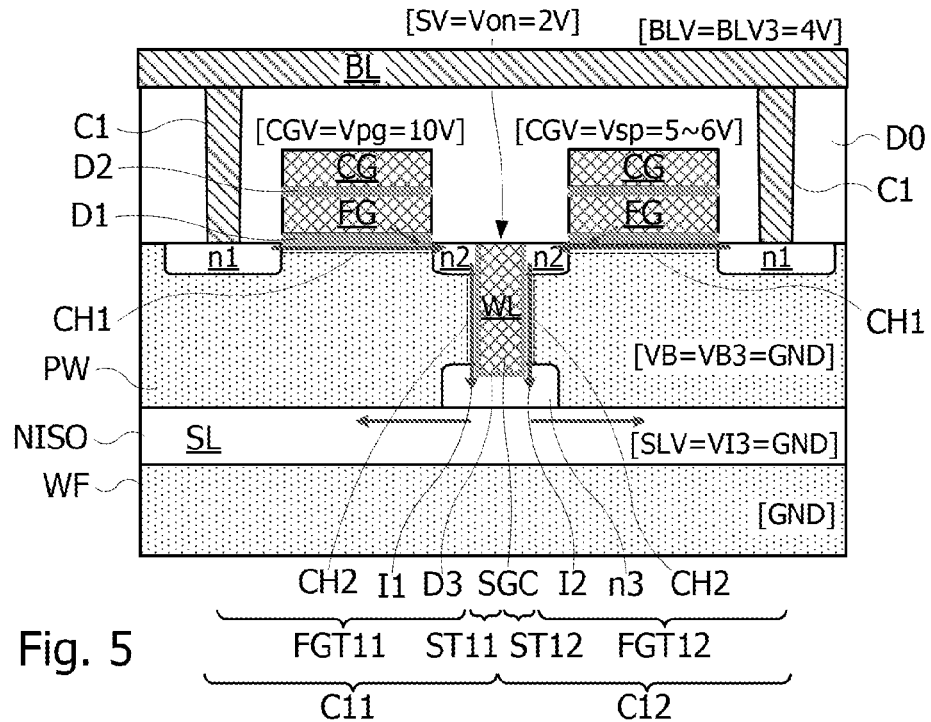
FIG. 5 is a schematic cross-section of the pair of memory cells in FIG. 2, showing a method for programming a memory cell, according to one embodiment.

FIG. 5 represents a pair of twin memory cells C11, C12, such as the one described above with reference to FIG. 2. Table PG2 in Appendix 1 describes, in connection with FIG. 5, values of voltages applied to the memory cells C11, C12, when programming the memory cell C11. The "Ref." column describes the reference given to each voltage value and the "E.g." column describes examples of voltage values. According to one embodiment, a soft programming is applied to the memory cell C12 during an operation of programming the twin memory cell C11 of the pair of memory cells C11, C12. This soft programming is done by subjecting the state control gate CG of the memory cell C12 to a positive voltage Vsp lower than the programming voltage applied to the state control gate CG of the memory cell C11. The voltage Vsp is established at a value sufficient to render the channel CH1 of the transistor FGT12 conducting and to establish an electric field capable of transferring a few electric charges into the floating gate FG of this transistor (the select transistor ST12 being on, just like the transistor ST11). However, the quantity of electric charges transferred into the floating gate is insufficient to switch the memory cell C12 to the programmed state. The current 12 passing through the channels CH1, CH2 of the transistors FGT12, ST12 of the memory cell C12 during a conventional programming of the twin memory cell C11 (FIG. 3) is thus used in FIG. 5 to perform a soft programming of the cell C12.

Figure 6:
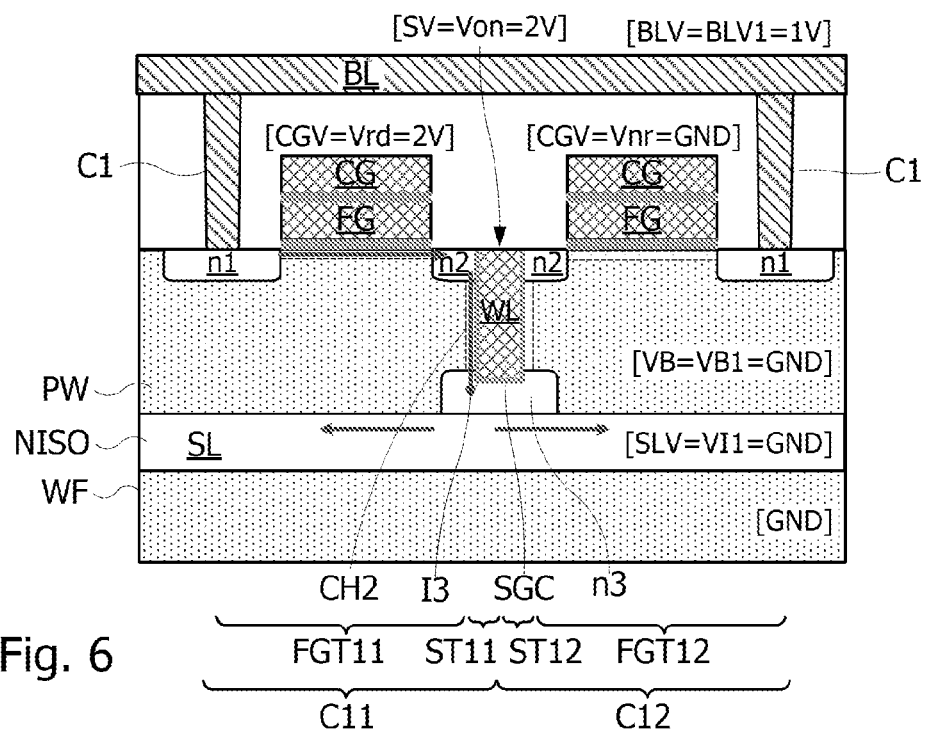
FIG. 6 is a schematic cross-section of the pair of memory cells in FIG. 2, showing a method for reading a memory cell, according to one embodiment.

Table RD2 in Appendix 1 describes, in connection with FIG. 6, values of voltages applied to the memory cells when reading the memory cell C11. When reading the memory cell C11, the gates of the two select transistors ST11 and ST12 receive the read-select voltage Von. The transistors ST11, ST12 are thus on. A current 13 (represented by arrows on FIG. 5) flows in the channel region CH1 of the transistor FGT11 and in the channel region CH2 of the transistor ST11. Therefore, the select transistor ST12 of the neighboring memory cell C12 is put to the on state.

According to one embodiment, the voltage CGV applied to the control gate of the transistor FGT12 is not set to the inhibit voltage Vinh, but to the voltage Vnr which is for example equal to the voltage GND. At this voltage value, the transistor FGT12 can only be on if it is in an over-erased state. However, if the memory cell C11 has been programmed, the memory cell C12 has undergone a soft programming, and thus cannot be over-erased, and if the memory cell C11 is in the erased or over-erased state, the memory cell C12 is too. At the voltages Vrd and Vnr, the transistors FGT11, FGT12 of the cells C11, C12 are both either off or on. As a result, the reading of the cell C11 cannot be disturbed by the possibly over-erased state of the twin cell C12.

Figure 7:
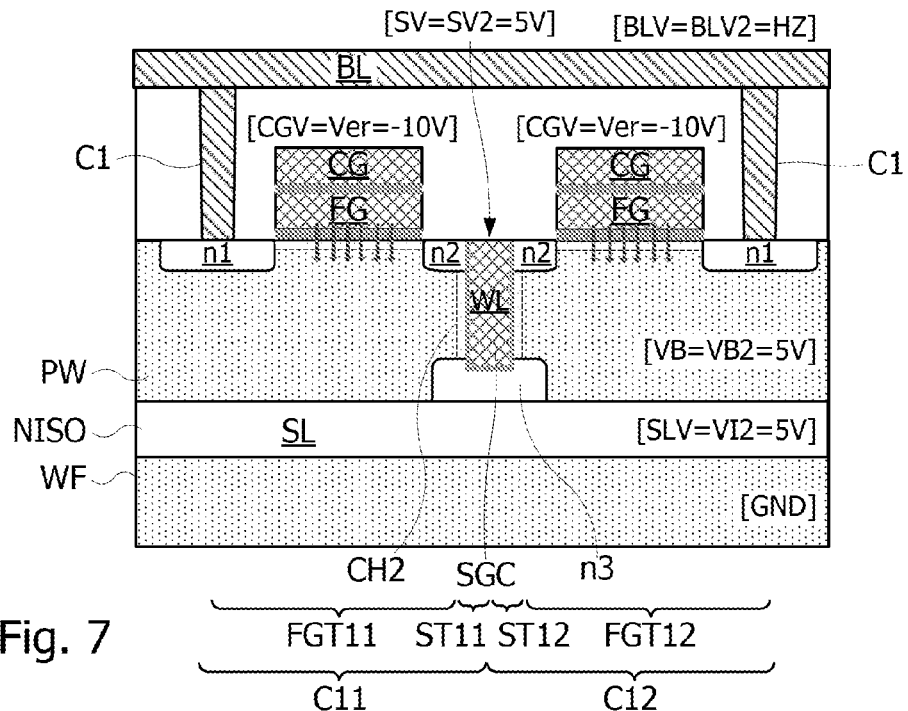
FIG. 7 is a schematic cross-section of the pair of memory cells in FIG. 2, showing a method for erasing the pair of memory cells, according to one embodiment.

Table ER2 in Appendix 1 indicates, in connection with FIG. 7, values of voltages applied to the twin memory cells C11, C12 during an operation of erasing the latter. According to one embodiment, the state control gates CG of the two twin memory cells receive the voltage Ver (=−10V in the example in FIG. 7 and Table ER2). The two memory cells C11, C12 are thus erased at the same time. Note that such an erasing operation is done systematically before an operation of programming one or both twin memory cells C11, C12.

Figure 8:
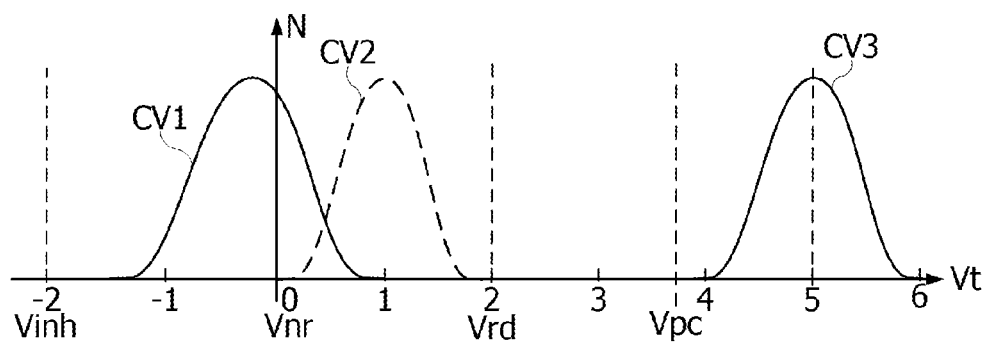
FIG. 8 represents curves of distribution of the number of memory cells in a memory, respectively in different states, according to the threshold voltage of the floating-gate transistor of the memory cells, FIG. 9 schematically represents circuits of a memory array in which the programming method can be implemented, according to one embodiment.

FIG. 8 represents curves CV1, CV2, CV3 of distribution of the number N of memory cells in a memory according to a threshold voltage Vt of their respective floating-gate transistors. The curves CV1, CV2, CV3 have a Gauss shape. The curve CV1 centered on approximately −0.5V, corresponds to the memory cells having undergone an erasing operation. The curve CV2 centered on approximately 1V, corresponds to the memory cells having undergone a soft programming. The curve CV3 centered on approximately 5V, corresponds to the memory cells in the programmed state. If the voltage Vnr substantially equal to the ground voltage GND, is applied to the select control gates SGC of the twin memory cells of memory cells to be read, the memory cells having negative threshold voltages Vt, i.e., that are over-erased (curve CV1), are on. The result is that the memory cells read (C11) that are twins of such memory cells (C12) are considered memory cells in the erased state. The soft programming that is done on a memory cell (C12) when programming the twin memory cell (C11), enables the curve CV1 to be shifted so as to obtain the curve CV2. As shown in FIG. 8, this shift is done so that no memory cell of the memory considered, including those that were in the over-erased state, has a threshold voltage Vt lower than the voltage Vnr, while avoiding memory cells that have undergone a soft programming having a threshold voltage greater than the read voltage Vrd (=2V in the example of Table RD2 and FIG. 8).

The soft programming thus performed is only done on the memory cells associated with a twin memory cell to be programmed, and simultaneously to the programming of the latter. As a result, the time necessary for the erasing and programming operations is not adversely affected, and the increase in current consumption is limited since it is only due to the soft programming operations which only relate to the twin memory cells of memory cells that must be programmed and that use a current that is present when programming the twin cell. However, not having to generate the negative inhibit voltage Vinh reduces the current consumption of reading operations. Compared with a soft programming done conventionally further to an erasing of memory cells, one operation of soft programming pairs of memory cells that must stay in the erased state is saved.

It can be noted that the reading of a memory cell belonging to a pair of erased memory cells is not disturbed by the presence in this pair of a memory cell in the over-erased state. Indeed, if the memory cell read is in the over-erased state, it will be conducting at the read voltage Vrd and thus seen as an erased cell. If the twin memory cell of the memory cell read is in the over-erased state, the two memory cells of the pair will be conducting, respectively at the read voltages Vrd and Vnr. The memory cell read will thus be considered to be in the erased state.

Figure 9:
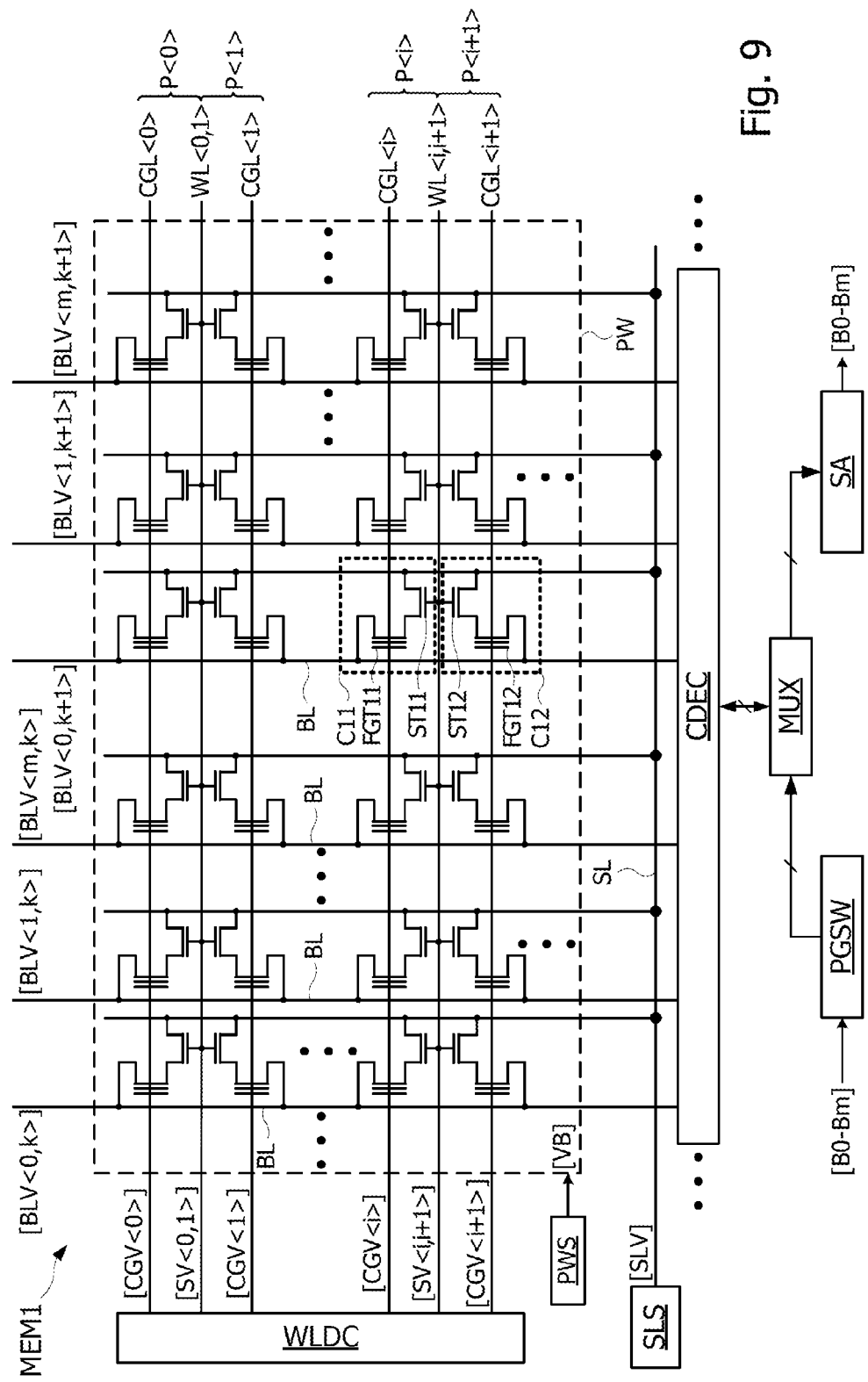

FIG. 9 represents a page-erasable memory MEM1 comprising a memory array made in a well PW. The memory array comprises M×N memory cells forming pairs of memory cells C11, C12, each memory cell C11, C12 comprising a charge accumulation transistor FGT11, FGT12 in series with a select transistor ST11, ST12. The select transistors ST11, ST12 of each pair share a common select gate SGC. It shall be noted that the two transistors ST11, ST12 with a common gate of each pair of memory cells of the memory MEM1 may be replaced with the single select transistor ST3 (FIG. 2).

The memory MEM1 comprises M pages P<i> each comprising a row of N memory cells, and a control gate line CGL<i>. FIG. 9 shows two first pages P<0>, P<1> of ranks 0 and 1, and two pages P<i>, P<i+1> of ranks i and i+1. The memory also comprises N bit lines BL<j,k>, each being coupled to a memory cell of the same rank in each page. The bit lines BL<j,k> can be grouped together in word columns k of m+1 bit lines, j ranging between 0 and m. FIG. 9 shows the bit lines of two word columns k and k+1. Each bit line BL<j,k> is connected to the drain regions n1 of the floating-gate transistors FGT of memory cells of the same rank j,k. Each control gate line CGL<i> is connected to the state control gates CG of the transistors FGT11, FGT12 of memory cells of the same rank i. The source regions n3 of the select transistors ST11, ST12 are connected to the layer NISO surrounding the well PW.

The memory MEM1 also comprises control lines WL<i, i+1> for controlling the select transistors ST11, ST12, which are connected to the common select gates SGC of the select transistors of the memory cells of two twin pages P<0>-P<1>, P<i>-P<i+1>. Thus, each control line WL<i,i+1> of rank i,i+1 is associated with the two twin pages P<i>,P<i+1> of ranks i and i+1 and controls the select transistors ST11, ST12 of the memory cells of these two twin pages.

The voltages applied to the various control lines BL<j,k>, CGL<i>, WL<i,i+1> of the memory array are supplied by units of the memory according to an address of a page to be erased or a group of memory cells to be read or programmed. These units comprise:

a column decoder CDEC, which couples the multiplexer MUX to the different bit lines, selector switches PGSW which, when programming the memory cells, apply the appropriate voltages BLV<j,k> to the different bit lines BL<j,k> connected to the memory cells of a word to be programmed B0-Bm, via the multiplexer MUX, a word line driver circuit WLDC that applies to the different word lines WL<i,i+1> the voltages SV<i,i+1> intended for the common select gates SGC of the select transistors ST11, ST12, and which applies to the different control gate lines CGL<i> the control gate voltages CGV<i> of the floating-gate transistors FGT11, FGT12, a source line switch SLS that applies the source line voltage SLV to the layer NISO forming a source plane, a well switch PWS that applies the substrate voltage VB to the well PW, and sense amplifiers SA, which apply to the different bit lines BL<j,k> via the multiplexer MUX the appropriate voltages BLV<j,k> when reading memory cells, and supply the bits B0-Bm of a binary word read in the memory.

These units are configured to supply the voltages described in Table PG2, and possibly in Tables RD2, ER2. In particular, during a programming operation, the word line driver circuit WLDC supplies the state control gates CG of the memory cells of the pair of word lines WL<i,i+1> including the memory cells to be programmed with the programming voltage Vpg and the soft programming voltage Vsp appearing in Table PG2. During an erasing operation, the word line driver circuit WLDC can supply the state control gates CG of the memory cells of twin pages P<i>-P<i+1> with the erase voltage Ver, causing all the memory cells of these two twin pages to be erased. During a reading operation, the sense amplifiers SA supply the read bias voltage BLV1 contained in Table RD2.

Thus, an operation of programming a word can be preceded by an operation of reading the pair of twin pages P<i>-P<i+1> in which the word to be written is located, of storing the words read and the word to be written for example in latches of bit lines BL<j,k> or in registers, and of erasing the twin pages P<i>-P<i+1>. The words of the twin pages are then successively programmed. The operation of actually programming the memory cells of a word is done in two steps. During a first step, the programming voltage Vpg is applied to the control gate line CGL<i> and simultaneously, the soft programming voltage Vsp is applied to the control gate line CGL<i+1>. In parallel, the bit lines BL<j,k> of the memory cells to be programmed of the word are subjected to the voltage BLV2, whereas the other bit lines remain at the voltage GND. During a second step, the programming voltage Vpg is applied to the control gate line CGL<i+1>, and simultaneously, the soft programming voltage Vsp is applied to the control gate line CGL<i>. In parallel, the bit lines BL<j,k> of the memory cells to be programmed of the page PG<i+1> are subjected to the voltage BLV2, whereas the other bit lines remain at the voltage GND.

It shall be noted that the application of a soft programming to a memory cell already programmed or the application of a programming to a memory cell having already undergone a soft programming, does not significantly change the threshold voltage of the floating-gate transistor of this memory cell compared to a memory cell having undergone only a programming.

According to one embodiment, each step of programming a word involves checking operations. These checking operations comprise an operation of checking the depleted state of the memory cells to be programmed, and an operation of checking the programmed state of the memory cells having undergone this operation. The depleted state can be checked by applying the voltage Vnr (=GND in the example of Table RD2) to the control gate line CGL<i> or CGL<i+1> of the memory cells to be checked and by performing a reading operation at this voltage. The programming state can be checked by applying a certain voltage Vpc (FIG. 8) to the control gate line CGL<i> or CGL<i+1> of the memory cells to be checked and by performing a reading operation at the voltage Vpc. The voltage Vpc can be chosen greater than the read voltage Vrd and lower than the threshold voltage of the floating-gate transistors in the programmed state.

Figure 10:
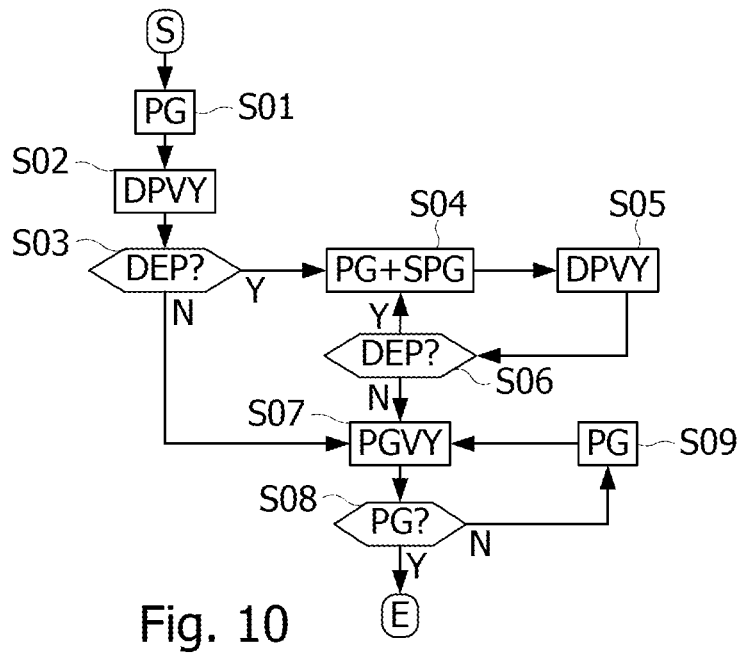
FIG. 10 represents steps executed when programming a memory cell.

According to one embodiment, the programming with checking of a memory cell is done by executing the steps S01 to S09 shown on FIG. 10. In Step S01, a simple programming operation is applied to the memory cell to be programmed, without applying any soft programming to the twin memory cell. The twin memory cell can thus receive on its control gate CG the voltage Vnp for example equal to the ground voltage. In Step S02, an operation of checking the depleted state of the memory cell to be programmed and of the twin memory cell is performed. In Step S03, if one of the twin memory cells is in the depleted state, steps S04, S05 and S06 are executed, otherwise steps S07 and S08 are executed. In Step S04, a programming operation is applied to the memory cell to be programmed and a soft programming operation is applied to the twin memory cell. Step S05 involves a new operation of checking the depleted state of the pair of memory cells. In Step S06, if one or other of the twin memory cells is in the depleted state, steps S04, S05 and S06 are executed again, otherwise steps S07 and S08 are executed. In Step S07, a checking operation of checking the programmed state is applied to the memory cell to be programmed. In Step S08, if the memory cell to be programmed is in the programmed state, the programming of the memory cell is over, otherwise, steps S09, S07 and S08 are executed. In Step S09, a simple programming operation is applied to the memory cell to be programmed.

Figure 1:
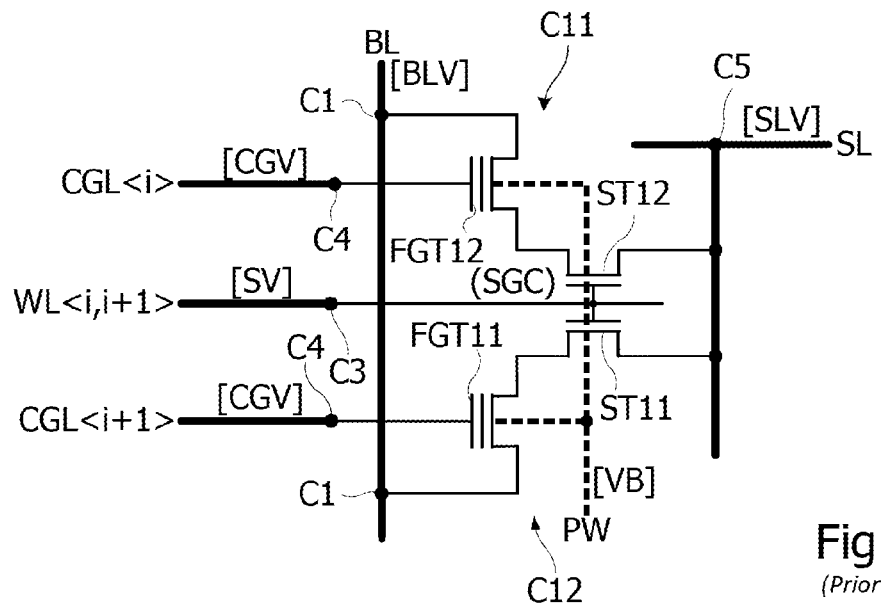
FIG. 1 described above, is a wiring diagram of the memory cells in FIG. 1.

It will be understood by those skilled in the art that the present disclosure is susceptible of various alternative embodiments and various applications. In particular, the disclosure does not necessarily apply only to a memory such as the one represented in FIG. 9, but can apply to any circuit comprising at least one pair of twin memory cells, such as the pair of memory cells in one or other of FIGS. 1 and 2. The present disclosure does not necessarily apply only to a page-erasable memory, but can apply to a memory erasable by sector of several pages, by word or even by bit.

The programming operation including a soft programming (Table PG2) can be implemented in a memory in which reading operations complying with Table RD1 and erasing operations complying with Table ER1 are implemented. Similarly, only one or other of the erasing and reading operations compliant with Tables ER2 and RD2 can be implemented in a memory implementing a programming associated with a soft programming (Table PG2) to program a memory cell of a pair of twin memory cells.

Furthermore, the programming and soft programming voltages are not necessarily applied simultaneously, respectively to the two memory cells of a pair of twin memory cells.

Figure 11:
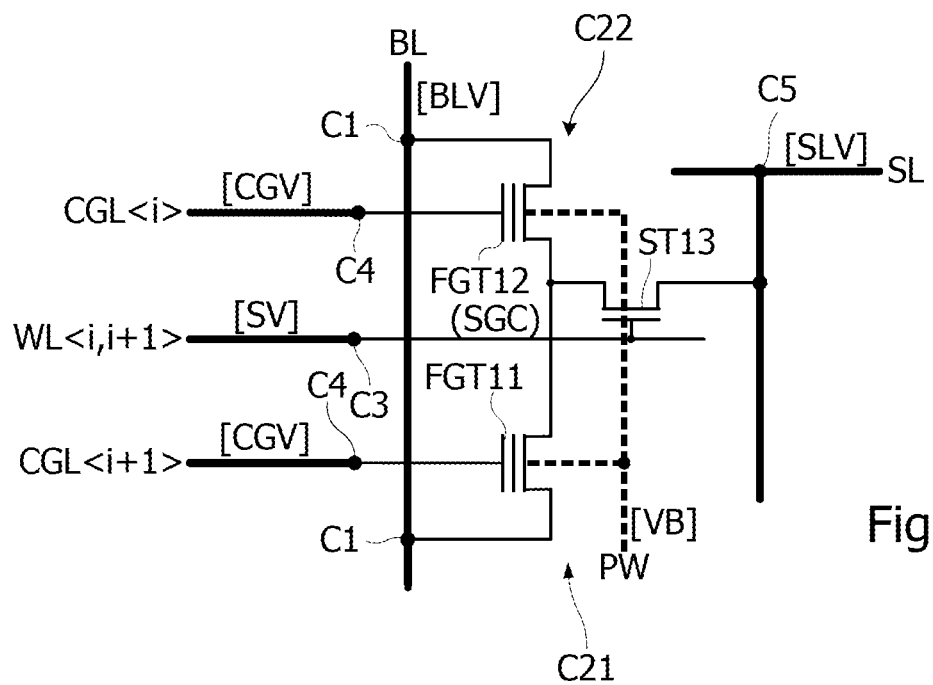
FIG. 11 is a wiring diagram of a pair of memory cells sharing a same select transistor.

The present disclosure also applies to a pair of twin memory cells sharing a single select transistor. FIG. 11 is a wiring diagram of such a pair of memory cells C21, C22. The pair of memory cells C21, C22 differs from the pair of memory cells C11, C12 in that the select transistors ST11, ST12 are replaced with a single transistor ST3 that they share.

Appendix 1 Being an Integral Part of the Description

Examples of Voltage Values when Reading a Memory Cell

| RD1 | Ref. | E.g. | Reading of the memory cell C11 (FIG. 5) |
|---|---|---|---|
| BLV | BLV1 | 1 V | Bit line bias voltage |
| CGV1 | Vrd | 2 V | Read voltage of the transistor FGT11 |
| CGV2 | Vinh | −2 V | Inhibit voltage of the transistor FGT12 |
| VB | VB1 | GND | Bias voltage of the well PW |
| SV | Von | 2 V | Read-select voltage of the transistors ST11, ST12 |
| SLV | VI1 | GND | Bias voltage of the source line NISO |

| RD2 | Ref. | E.g. | Reading of the memory cell C11 (FIG. 7) |
|---|---|---|---|
| BLV | BLV1 | 1 V | Bit line bias voltage |
| CGV1 | Vrd | 2 V | Gate voltage of the transistor FGT11 |
| CGV2 | Vnr | GND | Gate voltage of the transistor FGT12 |
| VB | VB1 | GND | Bias voltage of the well PW |
| SV | Von | 2 V | Read-select voltage of the transistors ST11, ST12 |
| SLV | VI1 | GND | Bias voltage of the source line NISO |

Example of Voltage Values when Erasing a Memory Cell

| ER1 | Ref. | E.g. | Erasing of the memory cell C11 |
|---|---|---|---|
| BLV | BLV2 | GND | Bit line bias voltage |
| CGV1 | Ver | −10 V | Erase voltage of the transistor FGT11 |
| CGV2 | Vner | 2.5 V | Non-erase voltage of the transistor FGT12 |
| VB | VB2 | 5 V | Bias voltage of the well PW |
| SV | SV2 | 5 V | Gate voltage of the transistors ST11, ST12 |
| SLV | VI2 | 5 V | Bias voltage of the source line NISO |

| ER2 | Ref. | E.g. | Erasing of the memory cells C11, C12 (FIG. 8) |
|---|---|---|---|
| BLV | BLV2 | GND | Bit line bias voltage |
| CGV1 | Ver | −10 V | Erase voltage of the transistor FGT11 |
| CGV2 | Ver | −10 V | Erase voltage of the transistor FGT12 |
| VB | VB2 | 5 V | Bias voltage of the well PW |
| SV | SV2 | 5 V | Gate voltage of the transistors ST11, ST12 |
| SLV | VI2 | 5 V | Bias voltage of the source line NISO |

Examples of Voltage Values when Programming a Memory Cell

| PG1 | Ref. | E.g. | Programming of the memory cell C11 (FIG. 4) |
|---|---|---|---|
| BLV | BLV2 | 4 V | Bit line bias voltage |
| CGV1 | Vpg | 10 V | Programming voltage of the transistor FGT11 |
| CGV2 | Vnp | GND | Non-programming voltage of the transistor FGT12 |
| VB | VB3 | GND | Bias voltage of the well PW |
| SV | Von | 2 V | Gate voltage of the transistors ST11, ST12 |
| SLV | VB | GND | Bias voltage of the source line NISO |

| PG2 | Ref. | E.g. | Programming of the memory cell C11 (FIG. 6) |
|---|---|---|---|
| BLV | BLV3 | 4 V | Bit line bias voltage |
| CGV1 | Vpg | 10 V | Programming voltage of the transistor FGT11 |
| CGV2 | Vsp | 5 V | Soft programming voltage of the transistor FGT12 |
| VB | VB3 | GND | Bias voltage of the well PW |
| SV | Von | 2 V | Gate voltage of the transistors ST11, ST12 |
| SLV | VB | GND | Bias voltage of the source line NISO |

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A method, comprising:
controlling a non-volatile memory on a semiconductor substrate, the non-volatile memory including:
a bit line,
first and second control gate lines,
a word line, and
a pair of twin memory cells that includes:
a first memory cell including a first floating-gate transistor having a control gate coupled to the first control gate line, a first conduction terminal coupled to the bit line, and a second conduction terminal coupled to a source line; and a first select transistor electrically coupling the second conduction terminal of the first floating-gate transistor to the source line and having a select control gate coupled to the word line, and
a second memory cell including a second floating-gate transistor having a control gate coupled to the second control gate line, a first conduction terminal coupled to the bit line, and a second conduction terminal coupled to the source line, and a second select transistor electrically coupling the second conduction terminal of the second floating-gate transistor to the source line and sharing the select control gate with the first select transistor, the method comprising:
programming the first memory cell by hot-electron injection, the programming including passing a first programming current through the first memory cell, by applying a first positive voltage to the bit line and a second positive voltage to the first control gate line, and
when programming the first memory cell, applying to the second control gate line a third positive voltage configured to cause a second programming current to pass through the second memory cell without switching the second memory cell to a programmed state.

2. The method according to claim 1, wherein applying to the second control gate line the third positive voltage includes applying the third positive voltage at a value that ensures a soft programming of the second memory cell, so that the second memory cell cannot have a negative threshold voltage regardless as to whether the second memory cell is in a programmed or an erased state.

3. The method according to claim 1, comprising reading the first memory cell, the reading including:
applying a positive read voltage to the control gate of the floating-gate transistor of the first memory cell, and
applying a zero voltage to the control gate of the floating-gate transistor of the second memory cell.

4. The method according to claim 1, comprising erasing the first and second memory cells, the erasing including simultaneously applying an erase voltage to the control gates of the floating-gate transistors of the first and second memory cells.

5. The method according to claim 1, wherein programming the first memory cell comprises checking a depleted state of the pair of twin memory cells, performing a programming of the first memory cell, and a soft programming of the second memory cell as long as one of the first and second memory cells is in the depleted state, followed by checking the programmed state of the first memory cell, and programming the first memory cell as long as the first memory cell is not in the programmed state.

6. A non-volatile memory on a semiconductor substrate, comprising:
a bit line,
first and second control gate lines,
a word line,
a pair of twin memory cells, including:
a first memory cell including a first floating-gate transistor having a control gate coupled to a first control gate line, a first conduction terminal coupled to the bit line, and a second conduction terminal coupled to a source line, and
a second memory cell including a second floating-gate transistor having a control gate coupled to the second control gate line, a first conduction terminal coupled to the bit line, and a second conduction terminal coupled to the source line, and
a programming circuit configured to program the first and second memory cells independently of each other; program the first memory cell by hot-electron injection using a programming current passing through the first memory cell, by applying a first positive voltage to the bit line and a second positive voltage to the first control gate line; and, when programming the first memory cell, apply to the second control gate line a third positive voltage that causes a programming current to pass through the second memory cell, without switching the second memory cell to a programmed state.

7. The memory according to claim 6, wherein the programming circuit is configured to apply the third voltage at a value that ensures a soft programming of the second memory cell and ensures that the second memory cell cannot have a negative threshold voltage regardless as to whether the second memory cell is in a programmed or an erased state.

8. The memory according to claim 6, wherein the programming circuit includes a word line decoder coupled to the word line and to the control gate lines, the decoder being configured, when reading the first memory cell, to apply a positive read voltage to the control gate of the first floating-gate transistor, and to apply a zero voltage to the control gate of the second floating-gate transistor.

9. The memory according to claim 6, wherein:
the pair of twin memory cells includes a first select transistor coupling the second conduction terminal of the first floating-gate transistor to the source line and having a select control gate coupled to the word line; and a second select transistor electrically coupling the second conduction terminal of the second floating-gate transistor to the source line and sharing the select control gate with the first select transistor; and
the select control gate is an embedded vertical gate having, for the first select transistor, a first vertical channel region extending opposite a first face of the embedded vertical control gate; and, for the second select transistor, a second vertical channel region extending opposite a second face of the embedded vertical control gate, and on an opposite side of the select control gate with respect to the first channel region.

10. The memory according to claim 9, wherein the pair of twin memory cells comprises:
a first doped region extending along a first upper edge of the embedded vertical gate, forming a drain region of the first select transistor and a source region of the first floating-gate transistor,
a second doped region extending along a second upper edge of the embedded vertical gate opposite the first upper edge, forming a drain region of the second select transistor and a source region of the second floating-gate transistor, and
a third doped region extending along two opposite lower edges of the embedded vertical gate, forming a source region common to the first select transistor and to the second select transistor, the first vertical channel region being positioned between the first and third doped regions and the second vertical channel region being positioned between the second and third doped regions.

11. The memory according to claim 6, wherein the memory cells of the pair of twin memory cells share a single select transistor that couples the second conduction terminal of the first floating-gate transistor to the source line and couples the second conduction terminal of the first floating-gate transistor to the source line.

12. The memory according to claim 6, wherein the programming circuit includes a word line decoder coupled to the word line and to the control gate lines, the decoder being configured, when erasing memory cells, to simultaneously apply an erase voltage to the first and second control gate lines.

13. The memory according to claim 6, wherein the programming circuit is configured, during programming the first memory cell, to:

check a depleted state of the pair of twin memory cells, and program the first memory cell and simultaneously apply a soft programming to the second memory cell, as long as one or other of the first and second memory cells is in the depleted state, and check a programmed state of the first memory cell, and program the first memory cell as long as the first memory cell is not in the programmed state.

14. The memory according to claim 6, comprising a row of pairs of twin memory cells connected to the word line and to the control gate lines, the programming circuit being configured to program a word formed by several memory cells of the row, connected to one of the two control gate lines, and, when programming the word, to:

perform an operation of reading the row of pairs of twin memory cells and storing the words read, perform an operation of erasing the row of pairs of twin memory cells read, perform a word programming of the memory cells of the row of pairs of twin memory cells, including programming respective first memory cells of the pairs of twin memory cells in the row, according to the words stored and possibly to a word to be written, and simultaneously perform a soft programming of respective second memory cells of the pairs of twin memory cells corresponding to the first memory cells being programmed, and perform a second operation of programming the second memory cells of the pairs of twin memory cells in the row, according to the words stored and possibly to the word to be written, and simultaneously perform a soft programming of the first memory cells corresponding to the second memory cells being programmed.

\* \* \* \* \*